(12) United States Patent
Midya et al.

(10) Patent No.: US 8,228,117 B2
(45) Date of Patent: Jul. 24, 2012

(54) QUIET POWER UP AND POWER DOWN OF CLOSED LOOP DIGITAL PWM MODULATORS

(75) Inventors: Pallab Midya, Palatine, IL (US); William J Roeckner, Carpentersville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 451 days.

(21) Appl. No.: 12/503,816

(22) Filed: Jul. 15, 2009

(65) Prior Publication Data

US 2011/0012674 A1 Jan. 20, 2011

(51) Int. Cl.
*H03F 3/38* (2006.01)
(52) U.S. Cl. ........................ 330/10; 330/251; 330/207 A
(58) Field of Classification Search ............... 330/10, 330/251, 207 A
See application file for complete search history.

(56) References Cited

U.S. PATENT DOCUMENTS

| | | | |
|---|---|---|---|
| 5,347,230 A | 9/1994 | Noro | |
| 5,613,010 A * | 3/1997 | Heyl et al. | 381/117 |
| 6,538,590 B1 | 3/2003 | Gaboriau et al. | |
| 6,720,825 B2 | 4/2004 | Hansen et al. | |
| 6,720,835 B2 | 4/2004 | Fujita | |
| 6,853,325 B2 | 2/2005 | Arizumi et al. | |
| 6,922,100 B2 | 7/2005 | Midya et al. | |
| 7,142,048 B2 * | 11/2006 | Miyagaki et al. | 330/10 |
| 7,312,654 B2 | 12/2007 | Roeckner et al. | |
| 7,432,759 B2 * | 10/2008 | Cho et al. | 330/10 |
| 7,492,218 B2 * | 2/2009 | Masuda et al. | 330/10 |
| 7,492,219 B1 * | 2/2009 | Cyrusian | 330/10 |
| 2007/0139103 A1 | 6/2007 | Roeckner et al. | |
| 2008/0278209 A1 * | 11/2008 | Kim | 327/175 |
| 2010/0315163 A1 * | 12/2010 | Takagi et al. | 330/207 A |

OTHER PUBLICATIONS

"A 20-W stereo class-D audio output power stage in 0.6-um BCDMOS Technology", by Morrow, P.; Gaalaas, E.; McCarthy, O., IEEE Journal of Solid-State Circuits, vol. 39, No. 11, Nov. 2004, pp. 1948-1958.

* cited by examiner

*Primary Examiner* — Patricia Nguyen
(74) *Attorney, Agent, or Firm* — Patents and Licensing LLC; Daniel W. Juffernbruch

(57) ABSTRACT

A switching audio amplifier circuit drives a switching audio amplifier stage using a digital PWM signal from an audio source. A PWM duty ratio modifier modifies an edge timing of the digital PWM signal to produce a modified digital PWM signal. A mode switch switches between the digital PWM signal and the modified digital PWM signal in a way that masks audible noise such as clicks and pops at power-up and power-down of the switching audio amplifier. An integrating error amplifier compares a difference between the digital PWM signal and an amplified PWM signal and integrates the difference to control the edge timing modified by the PWM duty ratio modifier. A mode controller can apply an offset signal to the integrating error amplifier and can control the switching of the mode switch.

18 Claims, 4 Drawing Sheets

QUIET POWER UP AND POWER DOWN OF CLOSED LOOP DIGITAL PWM MODULATORS

BACKGROUND OF THE INVENTIONS

1. Technical Field

The present inventions relate to switching amplifiers and, more particularly, relate to digital switching amplifiers employing pulse width modulation and closed loop feedback.

2. Description of the Related Art

When audio amplifiers are switched on and off, audible clicks and pops are often heard through speakers. This is not only annoying but gives a user a feeling of low quality equipment. It can also cause the feeling of damage being done to the components. Various approaches such as switching relays have been implemented to eliminate these clicks and pops.

One known type of audio amplifier is a digital PWM amplifier. Digital PWM amplifiers have high power efficiency, resulting in low current and reduced heat. Digital PWM amplifiers operate in the digital domain using digitally generated PWM signals. These digital PWM amplifiers are suitable for digitally integrated systems and can save cost. Although methods exist for quiet power up and power down of open loop digital PWM modulators, eliminating clicks and pops in closed loop digital PWM amplifiers is more difficult.

What is needed are efficient techniques to eliminate clicks and pops at power-up and power-down in closed loop digital PWM amplifiers.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein.

DETAILED DESCRIPTION OF THE PREFERRED EMBODIMENTS

Digital PWM audio amplifiers are power efficient and suitable for high-fidelity (hi-fi) audio applications. By using appropriate waveforms in the digital domain it is possible to obtain quiet power-up and power-down for an open loop digital PWM amplifier. Overall audio fidelity of an open loop digital PWM amplifier is limited by the performance of the power stage. To realize a high signal to noise ratio, dynamic range and linearity a feedback loop is wrapped around the power stage. However, the feedback loop has its own transients at power-up and power-down that introduce additional clicks and pops when power cycling at power-up or at power-down. What is also needed is a way to avoid the transients of the feedback loop so that a closed loop digital PWM amplifier has quiet power up and power down.

Figure 1:
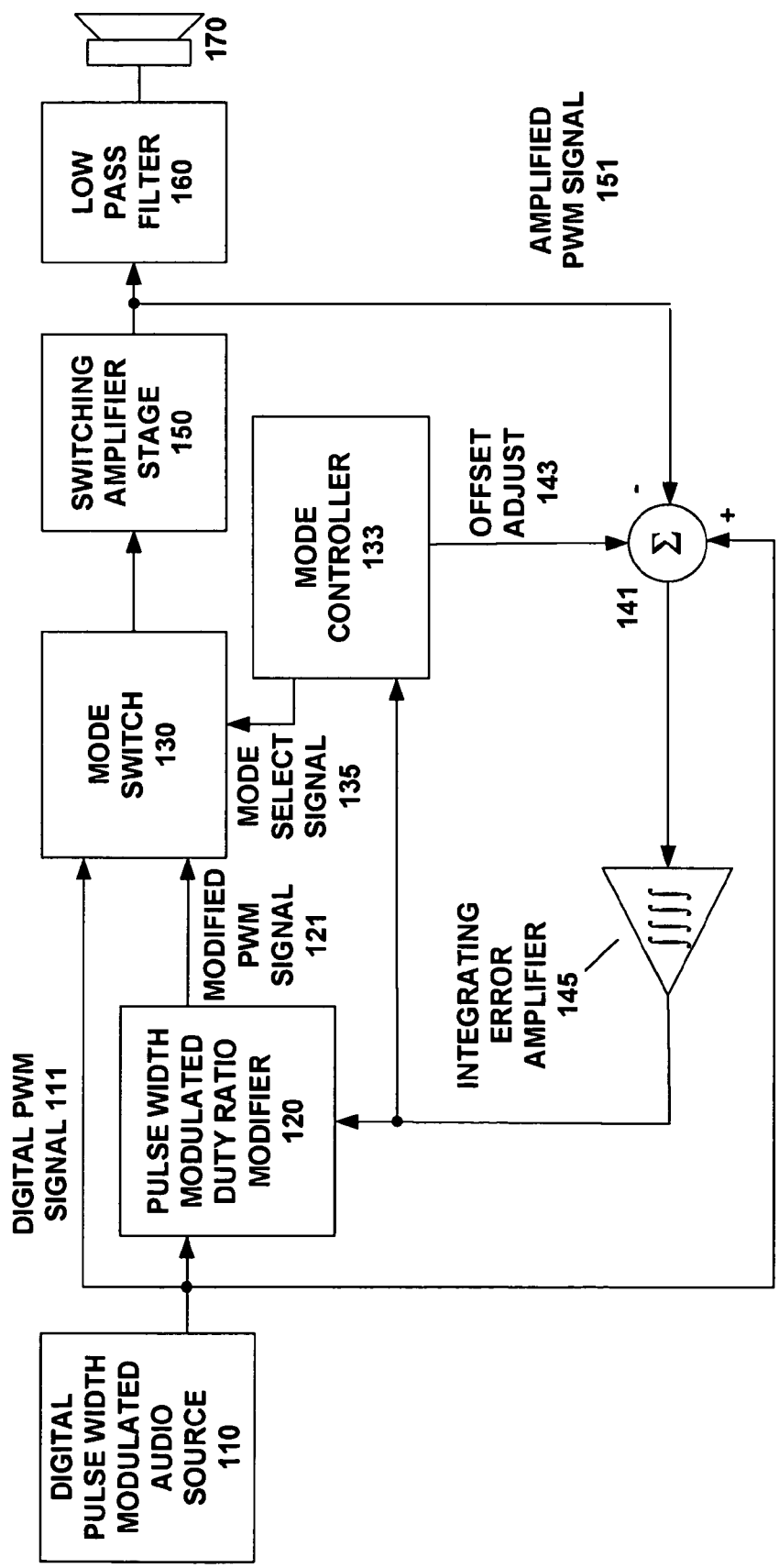
FIG. 1 illustrates a schematic diagram of a switching audio amplifier circuit driving a switching audio amplifier stage using a digital PWM signal from an audio source according to one embodiment of the present inventions.

FIG. 1 illustrates a schematic diagram of an improved switching audio amplifier circuit without audible noise such as the perception of clicks and pops when power cycling at power-up and at power-down of the switching audio amplifier according to one embodiment of the present inventions. Upon power-up, the switching audio amplifier circuit operates initially in a feed forward (open loop) mode and then switches to a subsequent closed loop mode. When in the initial open loop mode, appropriate digital waveforms are used to provide a quiet power up sequence. During the open loop mode the feedback signal from the power stage is monitored to provide a modified PWM signal. Control is implemented to adjust the modified PWM signal to match the open loop signal. The switchover occurs when there is signal alignment in time between the open loop digital PWM signal and the closed loop modified PWM signal. During power down, the sequence can be implemented in reverse.

While in open loop mode the switching audio amplifier circuit drives a switching audio amplifier stage 150 using an uncorrected digital PWM signal 111 from a digital audio source 110. A low pass filter 160 passes the audio frequencies for rendering on a transducer such as the speaker 170. A PWM duty ratio modifier 120 modifies edge timing of the digital PWM signal 111 from the audio source 110 to produce a modified digital PWM signal 121 The edge timing modification can be one of either an edge timing advance or an edge time delay.

A mode switch 130 switches between the digital PWM signal 111 from the audio source 110 and the modified digital PWM signal 121 from the PWM duty ratio modifier 120 in a way that masks audible noise such as clicks and pops at power-up and power-down of the switching audio amplifier. The mode switch 130 can do so by switching when the digital PWM signal 111 and the modified digital PWM signal 121 are aligned and have a same logic level.

An integrating error amplifier 145 or 245 compares a difference (error) from a summer 141 between the digital PWM signal 111 and an amplified PWM signal 151 from the switching audio amplifier stage 150 and integrates the difference. This integrated difference is used by PWM duty ratio modifier 120 to dynamically control the PWM edge timing advance or PWM edge timing delay to produce modified PWM signal 121.

A mode controller 133 provides an offset adjust 143 also summed in the summer 141. The mode controller 133 applies the offset adjust signal 143 to the summer 141 to drive an output of the integrating error amplifier 145 to zero. The mode controller 133 provides a mode select signal 135 to control the mode switch 130 to switch between the digital PWM signal 111 from the audio source 110 and the modified digital PWM signal 121 from the PWM duty ratio modifier 120. This controls the switching of the mode switch 130 once a steady state is reached after startup such as when the output of the integrating error amplifier 145 or 245 is near zero and when the digital PWM signal 111 and the modified digital PWM signal 121 have a same logic level.

In general, mode controller 133 provides a servo control to drive the output of integrating error amplifier 145 to zero. Offset adjust signal 143 is a control signal from the mode controller 133 used to zero out DC offsets associated with the closed loop operation and thus drive the output of integrating error amplifier 145 to zero. When the output of integrating error amplifier 145 is zero the modified PWM signal 121 will have substantially the same duty ratio as digital PWM signal 111. Under these conditions the mode switch 130 can switch from the open loop digital PWM signal 111 to the closed loop modified PWM signal 121 with little or no audibility.

Figure 2:
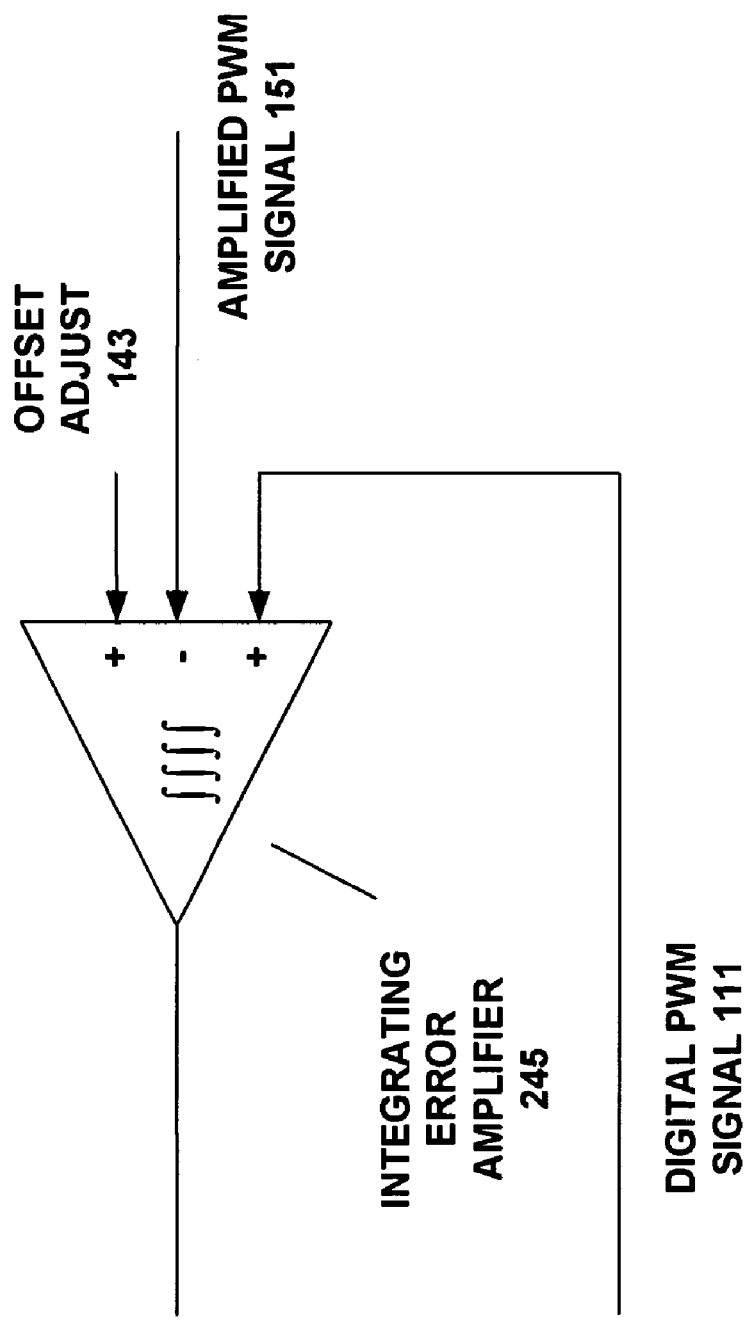
FIG. 2 illustrates a schematic diagram of an integrating error amplifier according to another embodiment of the present inventions.

The integrating error amplifier 145 and difference summer 141 can be separate components in one embodiment or alternately can be built in one integrating amplifier such as will be illustrated with respect to a different embodiment in FIG. 2. The mode controller 133 can be operatively coupled to the integrating error amplifier 145 in either embodiment.

FIG. 2 illustrates a schematic diagram of an integrating error amplifier according to another embodiment of the present inventions. The integrating error amplifier and difference summer are built in one integrating amplifier 245. The integrating amplifier 245 compares a difference (error) between the digital PWM signal 111 and an amplified PWM signal 151 from the switching audio amplifier stage 150 and integrates the difference to control the PWM duty ratio modifier 120. An offset adjust 143 is summed in the integrating amplifier 245.

This innovation uses this method to first power up the digital amplifier in open loop mode. The error amplifier output is monitored using the mode controller. Using this monitor and the feedback offset adjuster the difference between the corrected PWM (closed loop signal) and the uncorrected PWM (open loop signal) is minimized. When the DC offset (difference) is zero, then the PWM signals in both modes (the duty ratios) are essentially the same and aligned (in phase). Then, using the mode switch, the system is switched from open loop to closed loop operation. The purpose of these steps is to minimize any audible click due to the transition from open loop to closed loop operation.

In this innovation the digital PWM amplifier is powered-up in open loop quietly using appropriate digital PWM waveforms. With the circuit operating in open loop, the feedback loop is monitored and adjusted such that the feedback loop correction value is driven close to zero. During this operation the closed loop system may be run in first order in order to enhance loop stability. After the system is switched to closed loop operation the order of the feedback loop may be transitioned to normal operating order in a quiet manner. At power-down these operations may be performed in reverse order.

Figure 3:
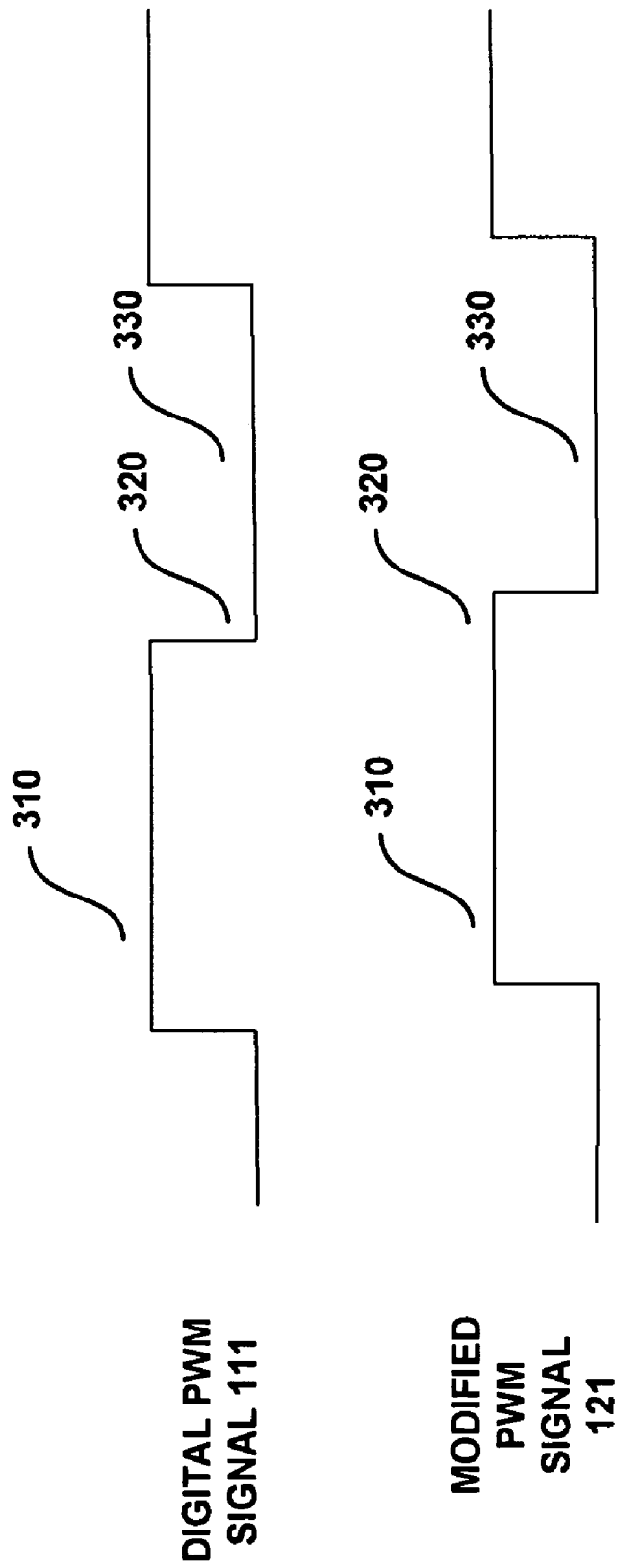
FIG. 3 illustrates signal timing diagrams of the digital PWM signal from the audio source and the modified PWM signal according to one embodiment of the present inventions.

FIG. 3 illustrates side-by-side signal timing diagrams of the digital PWM signal 111 from the audio source 110 and the modified PWM signal 121 according to one embodiment of the present inventions. The digital PWM signal 111 and the modified PWM signal 121 have the illustrated upper period 310 and lower period 330 with transition edges 320 therebetween. Note that the transition edge 320 of the digital PWM signal 111 may occur at a slightly different time than the transition edge 320 of the modified PWM signal 121. This may be caused by signal path delays associated with the PWM duty ratio modifier 120. For this reason, mode switch 130 is only allowed to switch between digital PWM signal 111 and modified PWM signal 121 when both signals have the same logic level.

Figure 4:
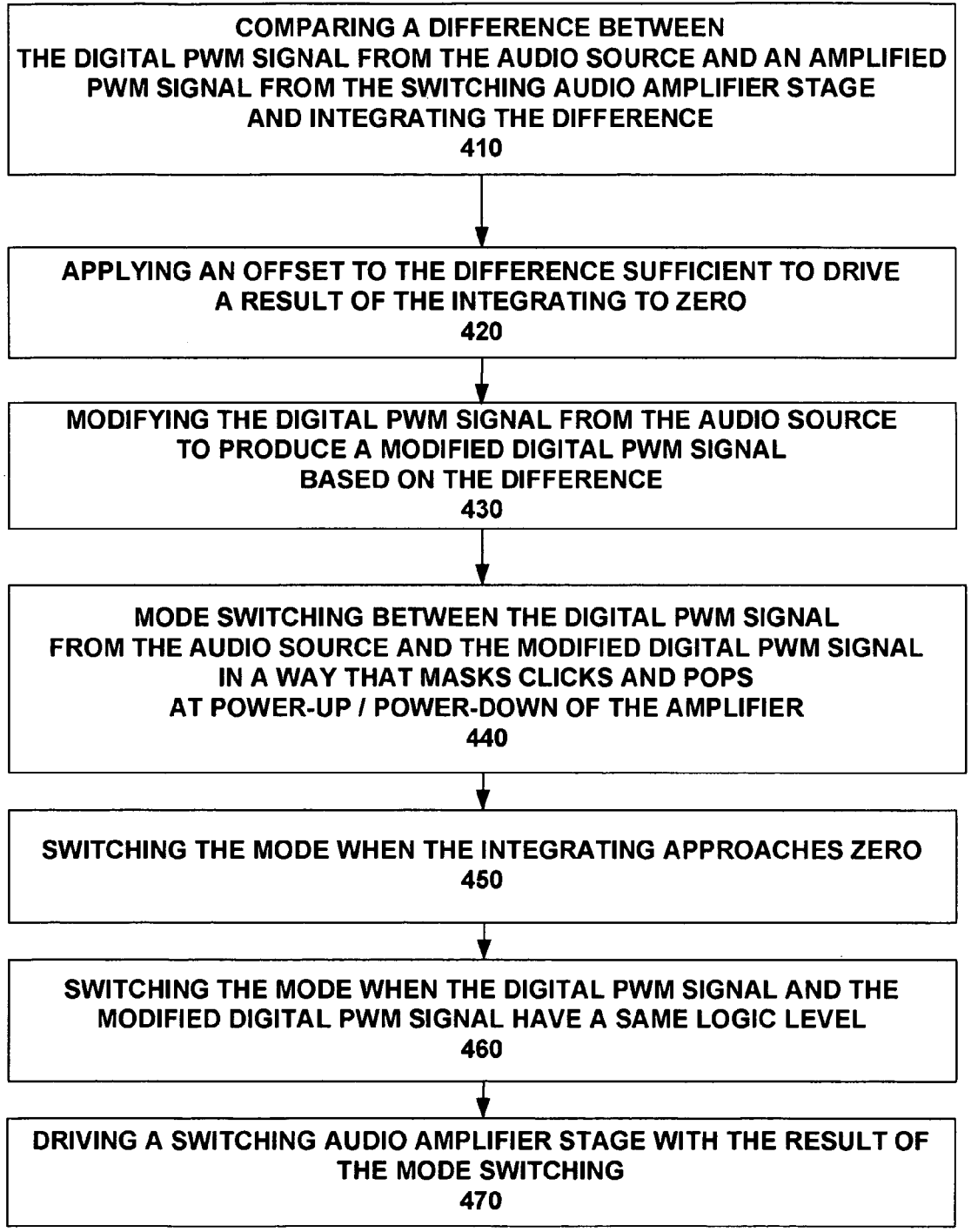
FIG. 4. illustrates a flow diagram for driving a switching audio amplifier stage using a digital PWM signal from an audio source according to one embodiment of the present inventions.

FIG. 4. illustrates a flow diagram for driving a switching audio amplifier stage using a digital PWM signal from an audio source according to one embodiment of the present inventions. In step 410 a comparison is made of a difference between the digital PWM signal from the audio source and an amplified PWM signal from the switching audio amplifier stage and integrating the difference. In step 420 an offset is applied to the difference sufficient to drive a result of the integrating to zero. In step 430 the digital PWM signal from the audio source is modified to produce a modified digital PWM signal based on the difference. Step 440 mode switches between the digital PWM signal from the audio source and the modified digital PWM signal in a way that masks audible noise including clicks or pops at power-up/power-down of the switching audio amplifier stage. Step 450 switches the mode when the integrating approaches zero. Step 460 switches the mode when the digital PWM signal and the modified digital PWM signal have a same logic level. The switching audio amplifier stage is finally driven in step 470 with the result of the mode switching.

This invention is specifically applicable to digital amplifiers having a feedback loop. The feedback can be in the digital or analog domains.

The signal processing techniques disclosed herein with reference to the accompanying drawings are preferably implemented on one or more digital signal processors (DSPs) or other microprocessors. Nevertheless, such techniques could instead be implemented wholly or partially as discrete components. Further, it is appreciated by those of skill in the art that certain well known digital processing techniques are mathematically equivalent to one another and can be represented in different ways depending on choice of implementation.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A switching audio amplifier circuit capable of driving a switching audio amplifier stage using a digital PWM signal from an audio source, comprising:

a PWM duty ratio modifier for modifying an edge timing of the digital PWM signal from the audio source to produce a modified digital PWM signal;

a mode switch having inputs operatively coupled to switch between the digital PWM signal from the audio source and the modified digital PWM signal from the PWM duty ratio modifier; and an integrating error amplifier for comparing a difference between the digital PWM signal from the audio source and an amplified PWM signal from the switching audio amplifier stage and integrating the difference to control the edge timing modified by the PWM duty ratio modifier.

2. A switching audio amplifier circuit according to claim 1, wherein the mode switch switches between the digital PWM signal from the audio source and the modified digital PWM signal from the PWM duty ratio modifier in a manner sufficient to mask audible noise including at least one of clicks and pops when power cycling the switching audio amplifier stage.

3. A switching audio amplifier circuit according to claim 1, wherein the mode switch switches at a time when the digital PWM signal and the modified digital PWM signal have a same logic level.

4. A switching audio amplifier circuit according to claim 1, further comprising a mode controller operatively coupled to the integrating error amplifier for applying an offset signal to the integrating error amplifier to drive an output of the integrating error amplifier to zero.

5. A switching audio amplifier circuit according to claim 4, wherein the mode controller is further operatively coupled to control the mode switch to control the switching between the digital PWM signal from the audio source and the modified digital PWM signal from the PWM duty ratio modifier.

6. A switching audio amplifier circuit according to claim 4, wherein the mode controller is further operatively coupled to the mode switch to monitor the output of the integrating error amplifier and switch the mode switch when the output of the integrating error amplifier is near zero.

7. A switching audio amplifier circuit according to claim 1, further comprising a mode controller operatively coupled to the mode switch to switch the mode switch from the digital PWM signal to the modified digital PWM signal once a steady state is reached after startup.

8. A switching audio amplifier circuit according to claim 7, wherein the steady state is reached when the output of the integrating error amplifier is near zero.

9. A switching audio amplifier circuit according to claim 7, wherein the mode controller switches the mode switch at a time when the digital PWM signal and the modified digital PWM signal have a same logic level.

10. A method of driving a switching audio amplifier stage using a digital PWM signal from an audio source, said method comprising the steps of:
   (a) comparing a difference between the digital PWM signal from the audio source and an amplified PWM signal from the switching audio amplifier stage and integrating the difference.
   (b) modifying an edge timing of the digital PWM signal from the audio source to produce a modified digital PWM signal based on the difference in said step (a);
   (b) switching between the digital PWM signal from the audio source and the modified digital PWM signal; and
   (d) driving the switching audio amplifier stage with a result of the switching of said step (c).

11. A method according to claim 10, wherein said step (c) of switching switches at a time when the digital PWM signal and the modified digital PWM signal have a same logic level.

12. A method according to claim 10, further comprising the step of:
   (e) applying in said step (a) an offset to the difference sufficient to drive a result of the integrating to zero.

13. A method according to claim 12, wherein said step (e) controls the switching in said step (b) between the digital PWM signal from the audio source and the modified digital PWM signal from said step (b).

14. A method according to claim 12, wherein said step (e) monitors the integration result of said step (a) and causes the switching in said step (b) to switch when the result of the integrating in said step (a) is near zero.

15. A method according to claim 10, further comprising the step of:
   (e) controlling the switching in said step (b) to switch between the digital PWM signal from the audio source and the modified digital PWM signal from the PWM duty ratio modifier.

16. A method according to claim 15, wherein said step (e) controls the switching in said step (b) to switch when the result of the integrating in said step (a) is near zero.

17. A method according to claim 15, wherein said step (e) controls the switching in said step (b) to switch at a time when the digital PWM signal and the modified digital PWM signal have a same logic level.

18. A method according to claim 10, wherein the switching in said step (b) switches between the digital PWM signal from the audio source and the modified digital PWM signal from said step (b) in a manner sufficient to mask audible noise including at least one of clicks and pops when power cycling the switching audio amplifier stage.

* * * * *